(12) United States Patent
Bouda

(10) Patent No.: US 7,994,685 B2
(45) Date of Patent: Aug. 9, 2011

(54) ELECTROMECHANICAL TRANSDUCER—ARTIFICIAL MUSCLE

(75) Inventor: Václav Bouda, Prague (CZ)

(73) Assignee: Czech Technical University in Prague, Prague (CZ)

( * ) Notice: Subject to any disclaimer, the term of this patent is extended or adjusted under 35 U.S.C. 154(b) by 341 days.

(21) Appl. No.: 12/087,261

(22) PCT Filed: Dec. 21, 2006

(86) PCT No.: PCT/CZ2006/000094
§ 371 (c)(1),
(2), (4) Date: Dec. 12, 2008

(87) PCT Pub. No.: WO2007/076732
PCT Pub. Date: Jul. 12, 2007

(65) Prior Publication Data
US 2009/0179520 A1 Jul. 16, 2009

(30) Foreign Application Priority Data
Dec. 30, 2005 (CZ) .................................... 2005-828

(51) Int. Cl.
*H02N 11/00* (2006.01)
(52) U.S. Cl. ........................................................ 310/300
(58) Field of Classification Search .................. 310/300, 310/309
See application file for complete search history.

(56) References Cited

FOREIGN PATENT DOCUMENTS

| IT | 1235887 B | 11/1992 | |
|---|---|---|---|
| JP | 5-252760 | * 3/1992 | ................ 310/309 |
| JP | 2005230957 A | 9/2005 | |
| WO | 0109181 A1 | 2/2001 | |
| WO | 2004036011 A2 | 4/2004 | |

OTHER PUBLICATIONS

International Search Report dated Jul. 24, 2007.

* cited by examiner

*Primary Examiner* — Thomas M Dougherty
(74) *Attorney, Agent, or Firm* — Buchanan Ingersoll & Rooney PC

(57) ABSTRACT

The function of the key element of the SMA, is based on a mutual alternating slipping of two systems of filaments. Its contraction is caused by the attractive effect of van der Waal's forces between the functional particles among the filaments. The relaxation is attained through the repulsive effect of the electrostatic repulsive forces between the functional particles. The alternating change of ionic concentration in the area of the particles results in the alternating function of van der Waal's attraction and repulsive electrostatic forces. The size and material of the particles, their configuration and working temperature must be specifically optimized. The total contraction of the key element results from the summation of its partial contractions. The total force and contraction of the SNA result from the summation of the key elements in the parallel (collateral) and/or serial (linear ranked) arrangements, respectively. Large compound actuators with high performance can be built from key elements using the modular design.

21 Claims, 8 Drawing Sheets

Top – sarcomere in mammalian skeletal muscle in the relaxation state. Bottom – swinging of the myosin heads drives the thin filament toward the center, thereby shortening the sarcomere, which contracts.

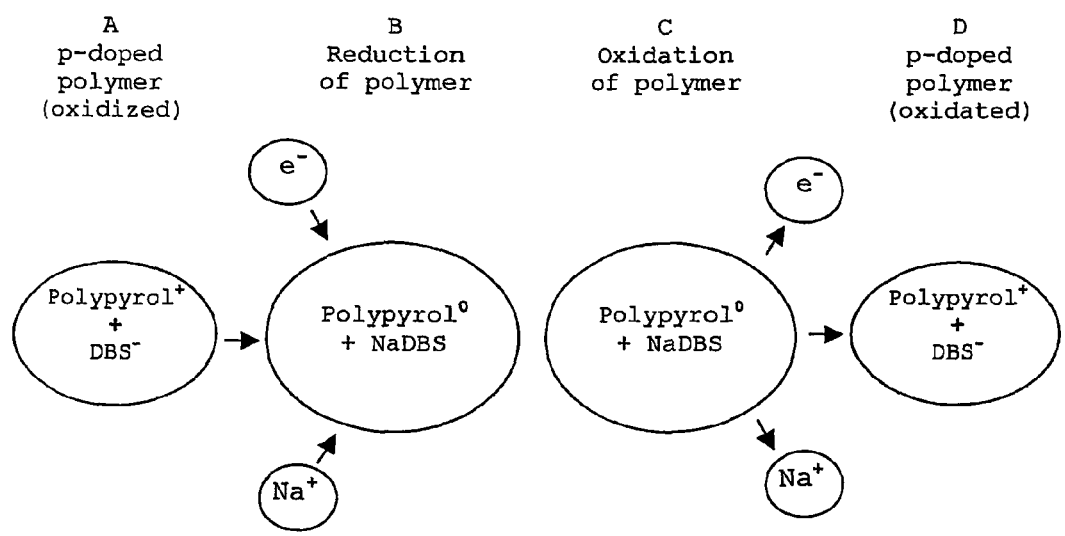
Figure 1. Electrochemical switching cyclic process (redox) and volume changes in the system polypyrol - NaDBS

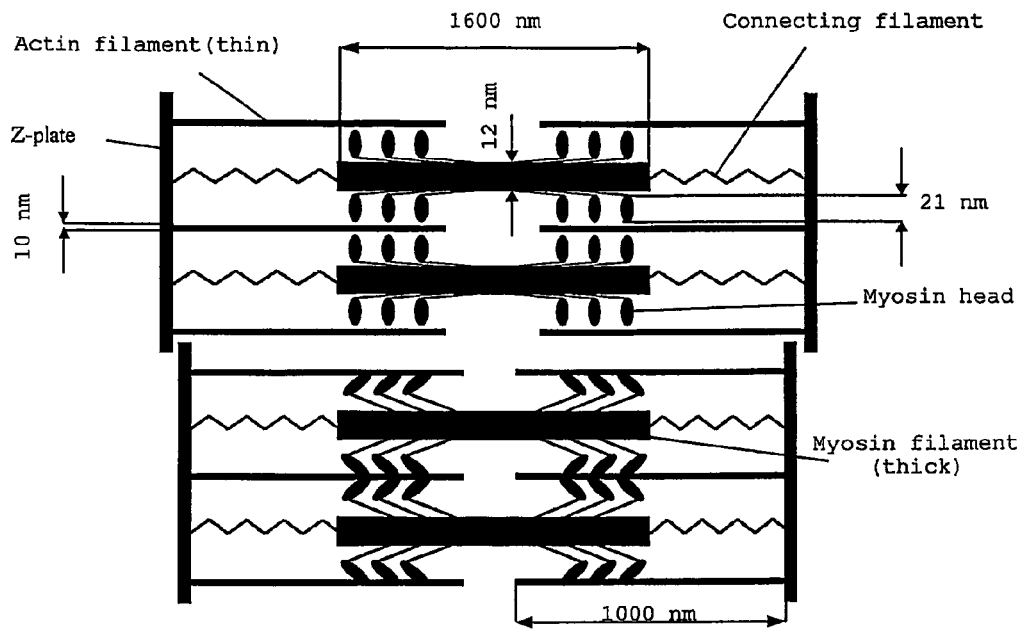
Figure 2. Top - sarcomere in mammalian skeletal muscle in the relaxation state. Bottom - swinging of the myosin heads drives the thin filament toward the center, thereby shortening the sarcomere, which contracts.

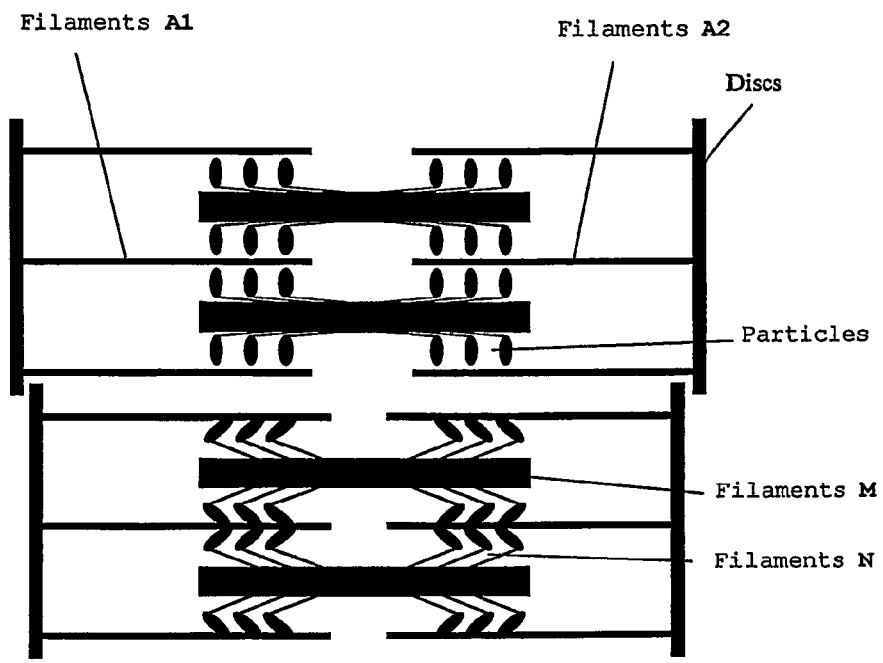

Figure 3. Construction of the key element of the sliding nanoactuator (SNA).

Top - The SNA in the relaxation state. The positions of the particles and filaments are controlled by electrostatic repulsion forces in the regular lattice.

Bottom - The SNA in the contraction state. Tilting of the particles drives the filament A1 and A2 toward the center, thereby shortening the SNA, which contracts.

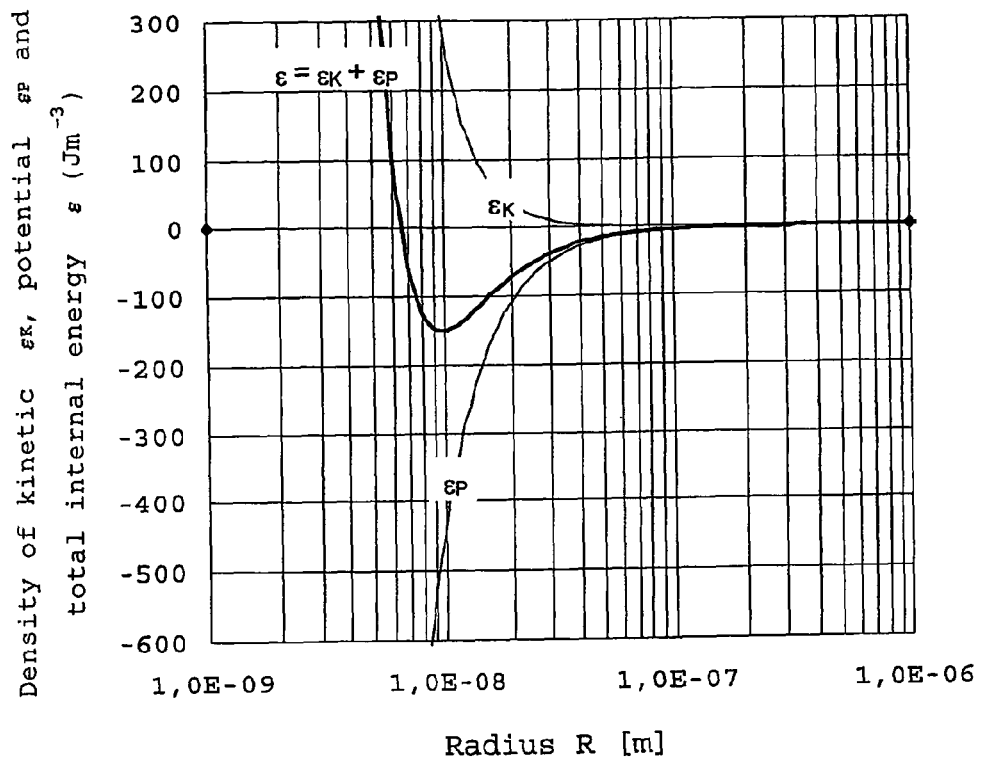
Fig. 4. Density of kinetic $\varepsilon_K$, potential van der Waals $\varepsilon_P$ and total internal energy $\varepsilon$, respectively, of the system of spherical particles vs. their radius R. $\Phi=0.185$, T=310 K, H=5E-21 J, $d_0=0.424$ nm.

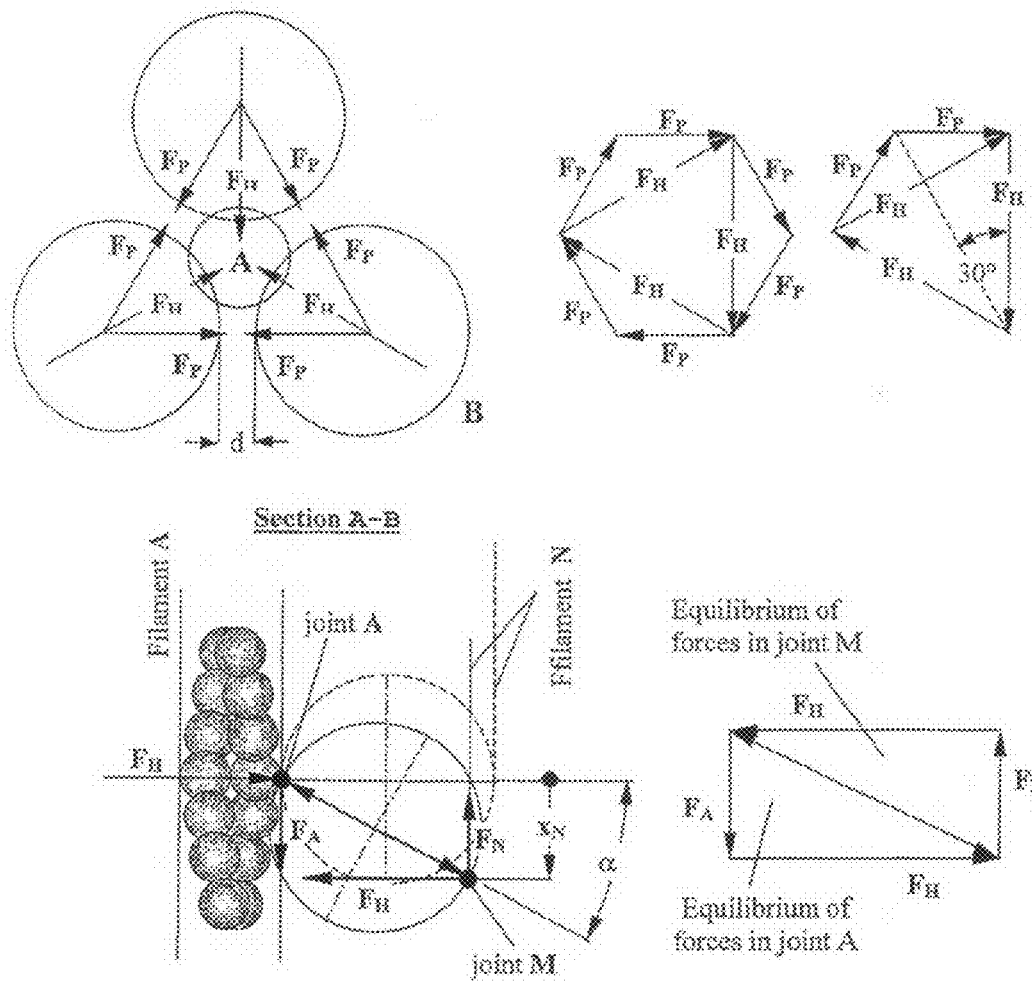
Fig. 5. Tension in filament generation; Top left: Arrangement of the functional spherical particles around filament A; Top right: Forces equilibrium in the plane perpendicular to filament A; Bottom left: Declination of particles, tension $F_A$ generation; Bottom right: Force equilibrium in the axial-section A-B.

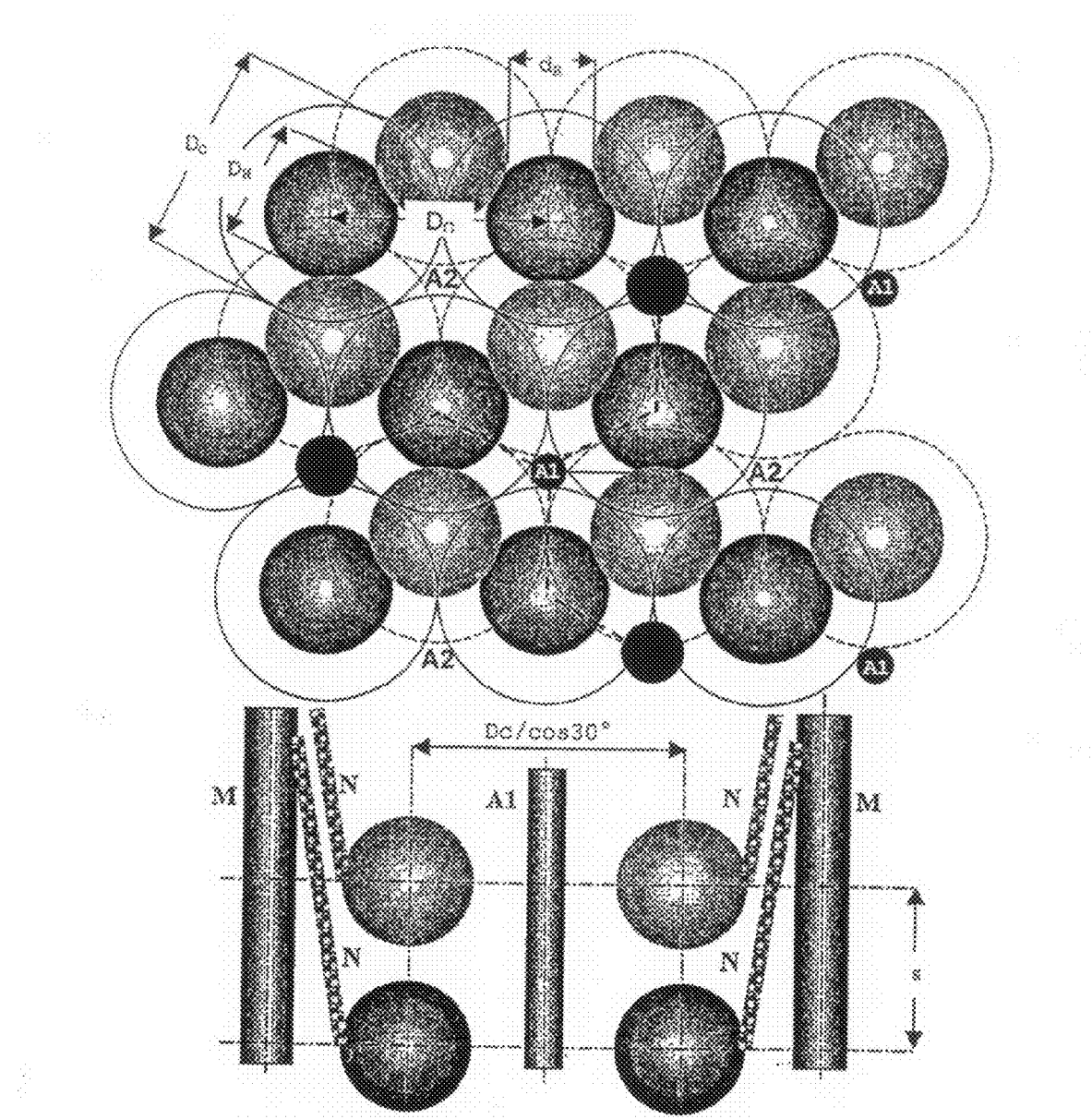

Figure 6. Detailed arrangement of particles separated by distance $d_a$ (computed from Equation 11) in the key element of the SNA in the relaxation state. In the cross-section (top), hexagonal closest packing of the coordination spheres of diameter $D_c$ controls the arrangement of the spherical particles of diameter $D=2R$. Half of the apertures between the particles are through the whole system. They accommodate free A1 filaments, A2 filaments, and M filaments with three hanging filaments N (bottom, not depicted on top), attaching three particles in each single layer. The A1 filaments are attached to the fore Z-plate, A2 filaments to the back Z-plate of the key element (see Fig.3).

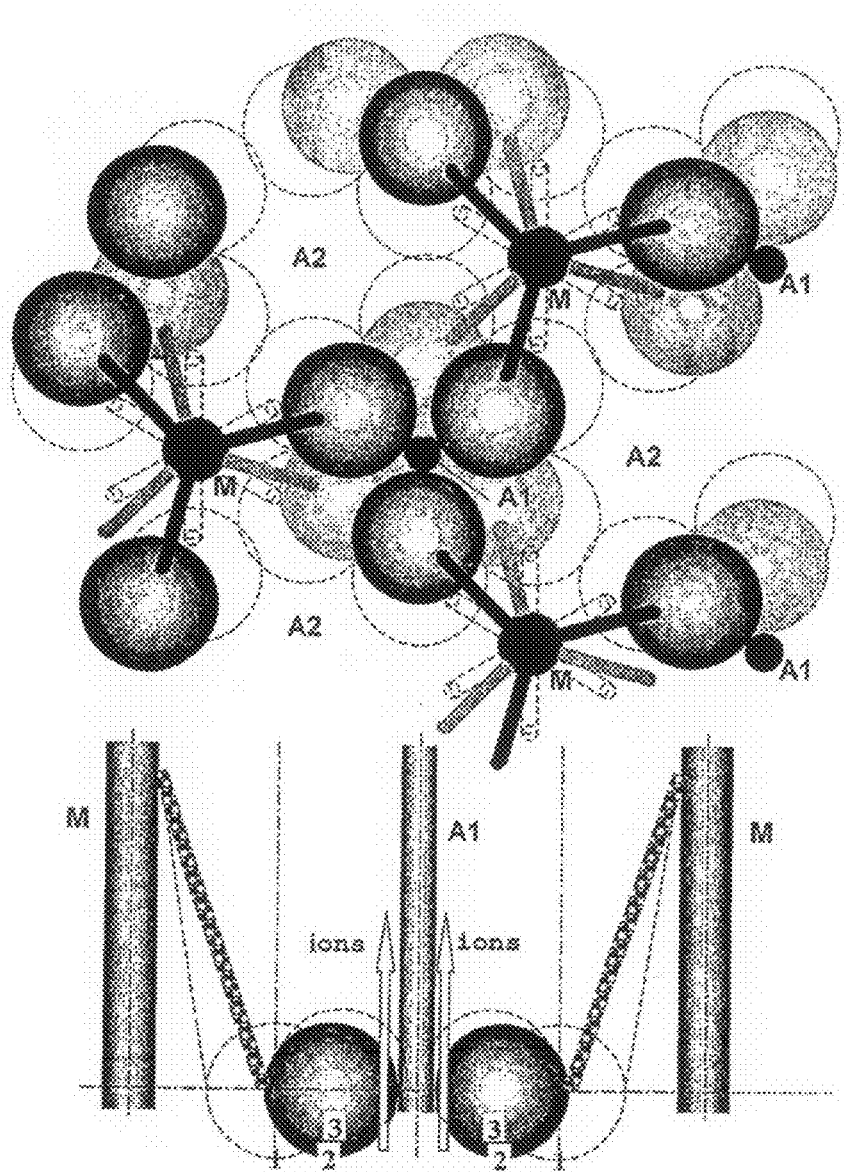

Fig. 7. In the contraction state (ions supply along filament A1), three spherical (or different particles) in every single layer approach each other from position 1 to position 2 (bottom) and compress actin filament A1. The kinetic pressure of the ions stream (or another effect) tilts the particles to position 3 (section M-particle center-A1-particle center-M (bottom). A further approach of the particles shifts actin filament A1 up.

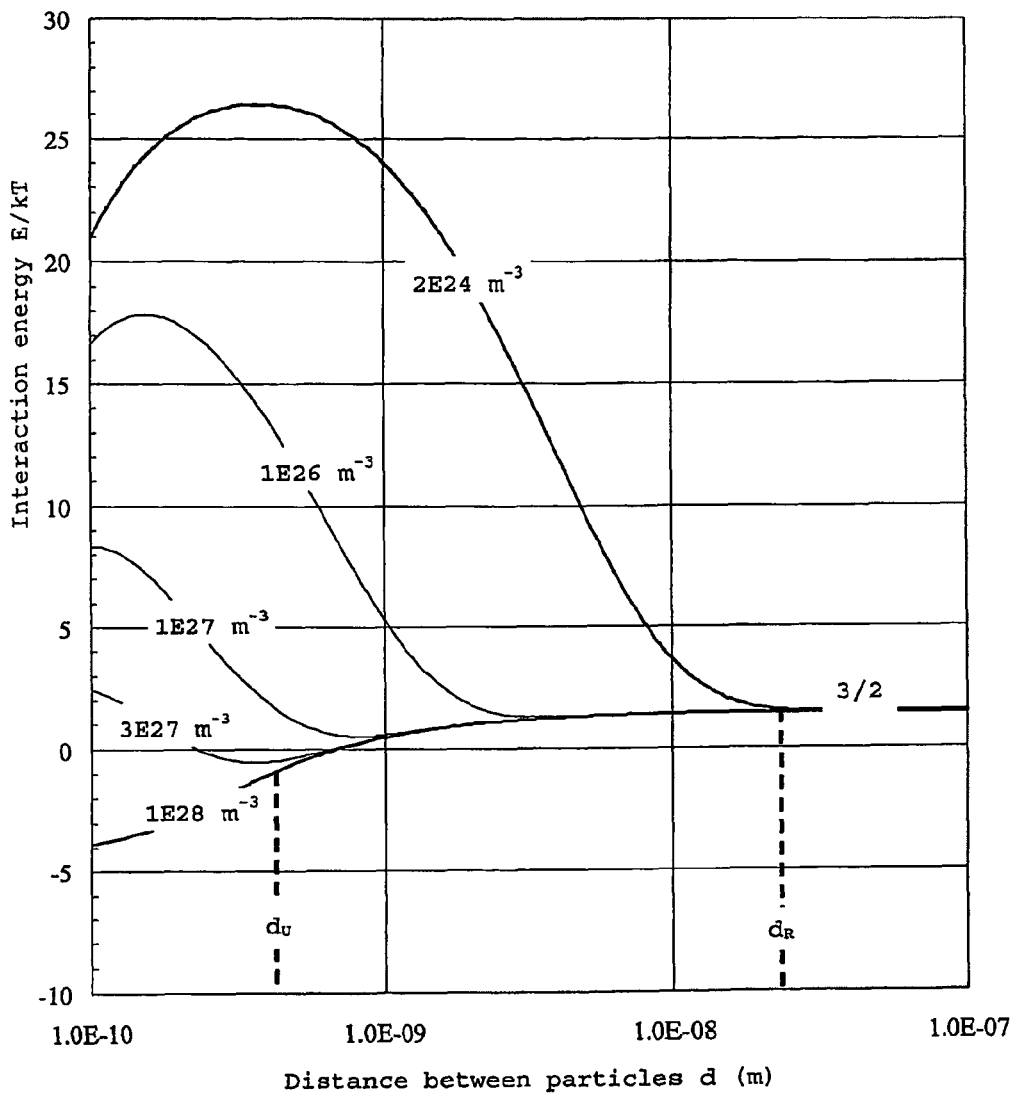
Fig. 8. Interaction of spherical particles of diameter $D_H$ = 21 nm in water (H = 5E-21 J, $\varepsilon_R$ = 80, T = 310 K) in accord with Equation (9) at contraction (n = 1E28 $m^{-3}$, $d_U$ = 0.424 nm) and relaxation (n = 2E24 $m^{-3}$, $d_R$ = 21.6 nm).

ELECTROMECHANICAL TRANSDUCER—ARTIFICIAL MUSCLE

TECHNICAL FIELD

An electromechanical transducer is a device which transforms electrical energy into mechanical work (e.g. as the product of generated force and shift). Transducers are applied extensively in all spheres of our environment. They are well established in classical engineering as electrical motors, electromagnets, electro-mechanical systems with pneumatic or hydraulic cylinders, etc. In microelectronics, the electromechanical transducers are called actuators that link the information-processing component of electronic control circuitry with technical processes. They are exploited in a number of applications including medical, space, robotic, microelectronic machines, etc., and can be found in CD players and cameras, washing machines, heating and air-conditioning systems, machining equipment, automobiles, boats and aircraft and even respiratory equipment and artificial limbs.

BACKGROUND OF THE INVENTION

The methods of electrical energy transformation into the force and shift are various. The actuators in microelectronics are based on the transducers properties of new or improved solid-state materials. They may offer advantages over conventional electromechanical transducers in that they lack moving parts. The input of the actuator should be driven electrically with low losses, currents, and voltages that are compatible with microelectronics whenever possible. The low voltages and currents also meet the requirements of low interference of the induced electrical or magnetic fields. However, the actuators have to induce needful and often high mechanical forces and large displacements at low voltages and currents. So, the most important aim is the design of the smallest possible actuators driven by low voltages and currents with low losses and high enough output of mechanical work. Mere size reduction of the classical engineering designs has only limited the potential and is incorrect in essence. New principles, materials and technologies head towards the new and acceptable actuators. Tab. 1 presents the main features of contemporary actuators in comparison with the new sliding nanoactuators (SNA, patent application).

TABLE 1

Contemporary actuators and SNA (patent application).

| Group | Paragraph | Principle | Deformation (%) | Force density (Pa) | Energy density (J/m$^3$, Pa) | Response time (s) | Wattage density (W/m$^3$) | Positioning accuracy (m) | Input voltage (V) |
|---|---|---|---|---|---|---|---|---|---|
| Practical application | 2.1 | Piezoelectric actuators | 0.3 | 5E7 | 1E5 | 1E−5 | 1E10 | 1E−9 | 100 |
|  | 2.2 | Magnetostrictive actuators | 0.3 | 5E7 | 1E4 | 1E−5 | 1E9 | 1E−8 | 10 |
|  | 2.3 | Shape memory actuators | 10 | 7E8 | 4E6 [1:155] | 1 | 4E6 | 1E−4 | 10 |
| Theory/ Experiments | 2.4 | Electronic polymers | 10 | 1E6 | 1E5 | 1E−3 | 1E7 | 1E−4 | 100 |
|  | 2.5 | Ionic polymers | 10 | 1E5 [2:161] | 1E4 | 0.1 | 1E5 [2:161] | 1E−4 | 1 |
|  | 2.6 | Conductive polymers | 3 | 3E6 [2:250] | 1E5 | 1 | 1E5 | 1E−4 | 10 |
|  | 2.7 | Carbon nanotubes | 1 [2:277] | 5E9 [2:277] | 3E7 [2:278] | 1E−6 [2:278] | 3E10 | 1E−9 | 1 |
|  | 2.8 | Molecular actuators | 30 | 5E5 | 1E4 | 1E−3 | 1E6 | 1E−9 | 0.1 |
| Natural muscle | 2.9 | 1 twitch | 3 | 4E5 | 1E3 | 1E−3 | 1E6 [2:161] | 1E−4 | 0.1 |
|  | 2.9 | 100 twitches | 300 | 4E5 | 1E5 | 0.1 | 1E6 | 1E−4 | 0.1 |
| SNA nanoactuator (proposal) | 3 | Hydrocarbon - Water*, 1 twitch | 3 | 5E5 | 1E4 | 1E−9 | 1E13 | 1E−9 | 0.1 |
|  | 3 | Hydrocarbon - Water*, 100 twitches | 300 | 5E5 | 1E6 | 1E−7 | 1E13 | 1E−9 | 0.1 |
|  | 3 | Carbon - Water*, 100 twitches | 300 | 1E7 | 1E8 | 1E−7 | 1E15 | 1E−9 | 0.1 |

Parameters represent the best reached/expected values.
*materials of functional nanoparticles - medium Piezoelectric Actuators The piezoelectric effect is based on the elastic deformation and orientation of electric dipoles in a crystal structure. Applying an electrical field causes the deformation of the dipoles, leading to a strain on the crystal. Many current materials used are based on alloys of lead, zirconate and titanate (PZT ceramics) or piezoelectric films on the basis of polyvinylidenfluoride (PVDF). They have been used successfully for many years to solve demanding problems in the field of precision positioning and active vibration control.

Piezoelectric actuators are characterized by high output actuation forces, short reaction times (or high operating frequency), and positioning accuracy of the order of a few nanometers—but only at low strains. Contemporary, rather high voltages are not directly compatible with voltages in microelectronics.

Magnetostrictive Actuators

Magnetostriction occurs in most ferromagnetic materials. Rare-earth-iron (Tb—Dy—Fe) "Giant Magnetostrictive Alloys" (GMAs) feature magnetostrains that are two orders of magnitude larger than ferromagnetic elements such as Nickel. The static magnetostrain of the GMAs permits the building of linear actuators offering small displacements and large forces.

Magnetoresistive tranducers have some specific advantages over piezoelectric actuators—low hysteresis, higher operating temperature, lower voltage driving signal, the possibility of current control and the possibility to separate the driving coil from the magnetoresistive rod. Although piezoelectric and magnetostrictive transducers are exchangeable in many applications—piezoelectric transducers have established a greater presence, particularly because of the greater variety of commercially available piezoelectric ceramics and ready-made actuators.

Shape Memory Actuators

The term shape memory (SM) refers to the ability of certain materials to recover a predefined shape. The SM effect is based on a solid-solid phase transition of the shape memory alloy that takes place within a specific temperature interval. Above the transition temperature, the crystal structure takes on the so-called austenitic state. The martensitic crystalline structure will be more stable for thermodynamic resons if the temperature of the material drops below the transition temperature. Boundaries of twinned martensite can easily be moved; for that reason SM elements can be deformed with quite low forces in the martensitic state. When heated up, the austenitic structure will be established again. At the same time, the SM material will return to its original shape. Nickel-titanium (NiTi) and nickel-titanium-copper (NiTiCu) have the best properties for actuator purposes. Its transformation is limited to approximately 100° C.

The element may exert high forces when recovering its predefined shape. Heating up the SM element is relatively simple. When conducting an electrical current, heat is generated because of Joule losses. During the cooling process, rather slow spontaneous processes remove heat. However, small actuators offer a much higher surface-to-volume ratio. Hence, heat transfer to the surrounding medium is strongly improved, resulting in faster response times of the actuators. Sputtering is a typical fabrication process employed. The very high work-per-volume ratio is highly valued if the space is limited. The disadvantage of low efficiency below 2% is determined by thermodynamics. Because of the low efficiency and low speed, electrical shape memory actuators offer a good choice for very special applications.

Electronic Polymers

Ferroelectric polymers, such as polyvinylidenfluoride (PVDF), exhibit spontaneous electric polarization. A large applied alternating current field (~200 MV/m) can induce electrostrictive (nonlinear] strains of nearly 2%.

Electrets are polymers that retain their electric polarization after being subjected to a strong electric field. Current applications of electrets include electrostatic microphones.

Dielectric EAP, also known as electrostatically stricted polymers can be represented by a parallel plate capacitor. The observed response of the film is caused primarily by the interaction between the electrostatic charges on the electrodes (Maxwell effect). The opposite charges on the two electrodes attract each other, while the identical charges on each electrode repel each other.

An electrostrictive graft polymer consists of two components, a flexible backbone macromolecule and a grafted polymer that can form a crystalline structure. The grafted crystalline polar phase provides moieties in response to an applied electric field and cross-linking sites for the elastomer system. This material offers a high electric-field-induced strain ~4%.

Liquid-crystal elastomer materials can be electrically activated by inducing Joule heating. The actuation mechanism of these materials involves the phase transition between nematic and isotropic phases over a period of less than a second. The reverse process is slower, taking about 10 seconds.

Ionic Polymers

Ionic Polymer Gel (IPG) is a solution or colloidal suspension that undergoes a physical or chemical change to a solid while retaining much of the solvent within the structure. The expansion and contraction of gels depend on the diffusion of water or solvent in and out of the matrix. The response time of a 1-mm thick sheet responds in about 20 minutes, 30-μm contractile bodies have been found in plants that contract in response to calcium ions in about 50 ms [2].

Ionic Polymer-Metal Composites (IPMC) form a subgroup of IPG. They consist typically of a thin (about 200 μm) polymer membrane with thin metal electrodes (about 10 μm). The polyelectrolyte matrix is neutralized with an amount of counter-cations, balancing the charge of anions covalently fixed to the membrane (e.g. Nafion, DuPont, neutralized with alkali metals). When an IPMC in the dissolved (i.e. hydrated) state is stimulated with a suddenly applied step potential (1-3 V), mobile counter-cations diffuse toward the cathode. As a result, the composite undergoes an initial fast bending, followed by a slow relaxation.

Conductive Polymers

Conductive polymers are chemically characterized by the so-called conjugation in which carbon double bonds periodically alternate with carbon single bonds along the polymer backbone (polypyrole, polyaniline, polyacetylene). Conductive polymers have a rather high electrical conductivity when doped with ions. Unlike in silicone, the dopants can be easily inserted and removed from the spaces they occupy between the polymer chains. In comparison with other semiconducting materials, the doping level can be very high: approximately one dopant counterion per four monomers. Construction of the actuators is possible due to the volume changes that take place in these materials during the changes in the doping level.

For instance, when a polypyrol film is grown electrochemically onto a positively charged electrode, the film will be automatically p-doped (FIG. 1A, electrons are removed, the polymer is oxidized). As the electrolyte, salt sodium dodecylbenzene sulfonate (NaDBS) can be used [1, p. 211]. When the salt is dissociated to $Na^+$ and $DBS^-$, the anions $DBS^-$ are built into the doped polypyrole network to maintain the charge neutrality of the polypyrol film. Because of their large size, $DBS^-$ anions are immobile and cannot diffuse easily out of the polymer. Polypyrol remains stable in the p-doped state when no external potential is applied. If a negative potential is applied to the electrode (FIG. 1B), electrons flow back into the polymer and satisfy the missing charges (electrons are accepted, the polymer is reduced). The cations $Na^+$ simultaneously enter the polymer to compensate for the immobile anions, forming the salt NaDBS. Macroscopically the polymer increases its volume. Depending on the magnitude of applied voltage, polypyrol can change the volume by up to 2%. If a positive potential is applied (FIG. 1C), then the electrons and cations move outside the polymer again, the volume of the polymer decreases to the state on FIG. 1D equivalent to FIG. 1A. So, the ionic concentration and hence the volume of polymer may be promptly controlled by an external electrical field. In general, the following three effects can be responsible for the volume changes in conductive polymers:

1) insertions of counterions (most dominant in the mentioned example of polypyrole);
2) conformations of chains (e.g. straight or twisted chains);
3) interactions between chains (e.g. electrostatic forces);

The most studied conductive polymer actuators are based on a "conductive polymer film/no volume change film", where the conductive polymer is the only electromechanically active material. The conductive polymer film is connected as a working-electrode in an electromechanical cell; an additional counter-electrode and an electrolytic solution are necessary.

The actuation mechanism of a conductive polymer actuator is based on an ionic exchange between the conductive polymer film and the electrolytic medium (either an electrolytic solution or a dry/wet polymer electrolyte). This is the most important factor that controls and limits the rather long response time of this kind of actuator. The low linear strain of the conductive polymer impedes the construction of the effective linear actuators working in the same way as natural muscles. This fact is an important limitation that has to be overcome looking for either new polymers or a new configuration where longitudinal changes should be amplified.

Carbon Nanotubes

Carbon nanotubes have exciting electrical and mechanical properties derived from their structure that consist of hollow cylinders of covalently bonded carbon. Double-layer charge injection seems to be the most promising actuation mechanism [2, p. 262]. This mechanism is quite distinct from that observed for conducting polymers. The ion flows, and consequently the electromechanical actuation behavior can be quite complex and is determined by the relative mobility of the polymer counter-ion and the ions in the electrolyte. In contrast, the carbon nanotube acts as an electrochemical capacitor with the charge injected into the nanotube balanced by the electrical double-layer formed by movement of the electrolyte ions to the nanotube surface. The charge injection causes quantum chemically based dimensional changes in the carbon-carbon covalent bond length of the surface atoms close to the double layer. Short response times and high force density are expected from this mechanism based on the function of strong covalent bonds. However, the problem with a small low linear strain remains to be solved.

Electrostatic repulsion between different tubes in the nanotube "forest" would cause repulsion between these tubes. An inter-tube electrostatic actuator mechanism may also be scientifically interesting.

Molecular Actuators

The stimulus-induced conformational change within the single molecule is the foundation of most biological molecular actuators. An example of the molecular actuator is the transport system powered by the motor protein kinesin [5]. The random coil-to-helix transformation is among the most powerful conformational changes [2, p. 304]. The common principal disadvantage of biomolecular motors is their limited lifetime in vitro, and the narrow range of environmental conditions that they are able to tolerate.

Natural Muscles

Mammalian skeletal muscles are considered highly optimized systems evolved over more than 600 million years. They are made up of individual muscle fibers—single cells, which are up to several centimeters long, cylindrical with diameters about 10 μm, and surrounded by a cell membrane. The muscle cells are made up of parallel myofibrils. Myofibrils are built up from several micrometer axial long contractile units called sarcomeres, which contain three filament types: thin, thick and connecting (FIG. 2). Thick (myosin) and thin (actin) protein filaments inside the sarcomere are recognized to play a central role in contraction. The actin and myosin proteins have a contractile mechanism, which can be interpreted as both sliding and folding [3].

(1) The sliding mechanism has become broadly accepted since about 1960. When the muscle cell is electrically excited by action potential, transmitted along their cell membrane by nerves, calcium ions are released from the sarcoplasmic reticulum (it is placed near to the Z-plates) and bind to the specific sites of the actin filaments. The closest myosin head groups then bind these sites and the thick and thin filaments seem to be mechanically connected, but no movement has occurred. Movement requires the head groups to change their angle and drag the thick and thin filaments past one another. Energy is needed for this process and is provided in the form of ATP. The head groups possess adenosine triphosphatase (ATPase) enzymatic sites that are active only when the heads are combined with actin. The active complex in the presence of $Mg^{2+}$ hydrolyzes ATP into inorganic phosphate and adenosin diphosphate (ADP). Part of the energy released is used to change the position of the head groups from extension to flexion. Unfortunately, scientific explanations of the swinging mechanism of the heads are rather confused. This process is repeated, and the thin filament is pulled toward the middle of the sarcomere and the sarcomere is shortened. When electric activity ceases, excess calcium is rapidly taken up by the sarcoplasmic reticulum. The rest of the ATP-ADP splitting energy is consumed when the calcium ions return to the sarcoplasmatic reticulum. Without the bound calcium, the head groups cannot remain bound to actin and without another timely electrical excitation, the sarcomere lengthens, and the muscle once again relaxes. However, with a sufficient high frequency repetition of electrical excitation, the sarcomere can contract up by individual twitches to its minimal length. The mechanism explains many known features of contraction.

(2) Folding mechanism. There are several reasons for considering the sliding mechanism as inadequate. Until the mid-1950's, muscle contraction was held to occur by a mechanism similar to protein folding, resembling a phase-transition. Also recently, Pollack [3] suggests that much of cellular biological functions may be governed by a single unifying mechanism—phase-transition. The sarcomere contraction is one of the main examples. It is supposed to be the result of the calcium induced phase transitions in all three filaments: condensation in thin filaments, folded—unfolded state transition in the connecting filaments, and helix to random coil phase transition of the myosin filament. However, several questions remain unanswered.

(3) Phase-transition of lattice of myosin heads answers the existing questions [6]. It includes both point (1) and (2) of the view of the interpretations. Van der Waal's attraction during the calcium-induced phase-transition of the array of myosin heads (reconstruction of their arrangement amongst themselves) represents the primary driving force. A simple lever mechanism, which converts the van der Waal's approaching of myosin heads into the thick and thin filaments sliding sets up the gearing mechanism.

The alternative model (3) also represents the theoretical background of the patent application.

SUMMARY OF THE INVENTION

Four points form the essentials of the invention;
1) Basic structure and function of the key element of the sliding nanoactuator (SNA).
2) The size of the particles is optimal to maximize the change of density of the potential energy of van der Waal's attraction.
3) The arrangement of the particles in the SNA allows its utmost approach in the contraction state and its utmost density during the actuator relaxation.
4) The cyclic change of arrangement of the particles induces a cumulation of the single contractions of the key elements.

Basic Structure and Function of the Key Element of the SNA

Construction of the key element of the SNA consists of, according to FIG. 3, at least two electrical semiconductive filaments A1 and A2 (an electro active polymer, for example) of 5 to 15 nm in diameter of the cylindrical cross section for example), connected to the electrical semiconductive disks. There is a symmetrical distribution of at least three particles (a spherical particle of radius R=5 to 20 nm, in example) around the filaments A1 and A2. The particles are linked to filament N (a filament of 1 to 5 nm in diameter of a circular cross section, for example), embedded in a bundle of filaments or the stronger filament M. The surface of the particles, disks and filaments has the same electric charge, for instance, a negative one.

The positions of the particles and filaments in the relaxation state are controlled by electrostatic repulsion forces in regular arrangement (FIG. 3—Top). The filaments A1, A2, N, M, disks, and solid particles are placed in a liquid or gaseous medium. In an advantageous manner, the particles are arranged in a hexagonal lattice with the closest arrangement (hcp), according to FIGS. 5 and 6.

In the contraction state (FIG. 3 bottom, FIG. 5 top left, and FIG. 7), filaments A1 and A2 are surrounded by a layer of ions with an opposite charge to the charge on the surface of the whole part of the SNA. The layer of ions is advantageously made up of multivalent ions. For example, in the case of a negative charge on the filaments surface, an electrical field forces the ions to pass along filaments A1 and A2 from the disks. A high concentration of ions causes the collapse of the electrical double layer on the particles and filaments A1 and A2. The collapse subsequently causes local neutralization of their electrostatic repulsion. Constant influence of van der Waal's attractive forces in the area of filaments A1 and A2 causes mutual attraction of the particles and their contact with filaments A1 and A2. Contact of the particles with filaments A1 and A2 and the continuing attraction of the particles result in the tilt of the particles that drive filaments A1 and A2 toward the center, thereby shortening both the key elements of the SNA and the whole SNA. The SNA contracts by one single twitch, for instance 15 nm.

The changes of the polarization of the disks force the ions to be cyclically transported to the particles and back to the disks. The main part of the energy supply is consumed by the ions return to the disks.

The total contraction of the key element of the SNA is the product of the summation of the single twitches. The single twitches result from the alternating tillting of the particles and their return to the original positions. In an exemplary manner, 100 twitches over 15 nm can induce a total contraction of a single element of up to 1.5 micrometers.

Continual reduction of the concentration of ions in the area of the filaments causes the relaxation (extension).

The key elements of the actuator can be connected in series and/or parallel reaching the desired resulting movement and/or force.

Functional Particles (Their Size, Material, Utmost Approach, Working Temperature) and the Amount of Transformed Energy The approach of two identical spherical particles of radius R (m) from the distance of their surfaces d→∞ to d<<R reduces the potential energy of their van der Waal's attractive bond from zero to a substantially negative value $$E_p = -\frac{HR}{12d} \qquad (1)$$

where H(J) is Hammaker's constant, which represents the quality of the particle's material and the medium, in which it is placed [7, 8].

The total internal energy $E_1$ of the single particle in the three particle system, in FIG. 5—top left, is the sum of the mean kinetic energy of the thermal movement of the particle $(3/2)kT$ and the potential energy of van der Waal's attractive bond in the direction of the bonds.

$$E_1 = E_K + E_P = \frac{3}{2}kT - \frac{HR}{12d} \qquad (2)$$

where k is Boltzmann's constant 1.38E-23 (J/K) and T is the thermodynamic temperature (K).

The volume density of the internal energy of the system of particles $\in (J/m^3)$ $$\in = nE_1 = n(E_K + E_P) \qquad (3)$$

where n is the number of particles per unit volume 1 $m^3$

In the case where the spherical particles have radius R $$n = \frac{\Phi}{\frac{4}{3}\pi R^3} \qquad (4)$$

where $\Phi$ is the filling of the space with spherical particles, $0 < \Phi < 1$.

According to Equation (3), substituting E1 for Equation (2), d for the smallest possible approach of the particles $d_0$, and n for Equation (4), one obtains the dependence of the volume density energy $\in$ on the radius of the spherical particle R.

$$\varepsilon = \frac{\Phi}{\frac{4}{3}\pi R^3}\left(\frac{3}{2}kT - \frac{HR}{12d_0}\right) = \Phi\frac{9}{8\pi}\frac{kT}{R^3} - \Phi\frac{1}{16\pi}\frac{H}{R^2 d_0} \qquad (5)$$

FIG. 4 demonstrates Equation (5). The course of the graph shows a distinct minimum. The minimum represents the lowest possible decrease of the volume density energy $\in$ at the radius of the particles R*. The radius R* can be computed from Equations (6) and (7)

$$\frac{\delta\varepsilon}{\delta R} = -\Phi\frac{9kT}{8\pi}\frac{3}{R^4} + \Phi\frac{H}{8\pi d_0}\frac{2}{R^3} = -\Phi\frac{27kT}{8\pi R^4} + \Phi\frac{H}{4\pi d_0 R_3} = 0 \qquad (6)$$

$$R^* = 27kT\frac{d_0}{H} \qquad (7)$$

Substituting R into Equation (5) for R* from Equation (7), one obtains the utmost decrease of the volume density energy $\in$ of the system of particles $$\varepsilon^* = \Phi\frac{9}{8\pi}\frac{kT}{\left(27\frac{kTd_0}{H}\right)^3} - \Phi\frac{1}{16\pi}\frac{H}{27\left(\frac{kTd_0}{H}\right)^2 d_0} = -\frac{\Phi}{\pi 6^7 (kT)^2}\left(\frac{2H}{d_0}\right)^3. \qquad (8)$$

From Equations (7) and (8), follow the basic rules for the construction of the single element of the SNA with the maximum transformed energy per volume unit and one single twitch;

Rule 1 The size of the particle (for example, the spherical particle of radius R*) must be in a specific relationship to the working temperature T, at the utmost approach $d_0$ and Hammaker's constant H for example, for the spherical particle according to Equation (7).

Rule 2 The amount of the transformed energy is directly proportional to the filling of the space with the particles (for example, for spherical particles represented by the coefficient $\Phi$ in Equation (4)).

Rule 3 The amount of the transformed energy is inversely proportional to the $3^{rd}$ power of the utmost approach of the particles $d_0$.

Rule 4 The amount of the transformed energy is directly proportional to the $3^{rd}$ power of the Hamaker constant H.

Rule 5 The amount of the transformed energy is inversely proportional to the $2^{nd}$ power of the working thermodynamic temperature T.

Arrangement of Particles in the Relaxation State

The surface of all components of the key element of the SNA is charged with the electrical charge of the same sign (for instance negative by specific absorption from the environment, by dissociation of the surface layers of particles, by electrical charges from outside the electrical circuit or by some other mechanism). In the environment with a low concentration of counterions, the omnipresent same charge results in the omnipresent repulsion of all the components. The repulsion interaction between components results in the formation of a regular structure resembling the crystalline lattice.

The arrangement of functional particles in the relaxation state is determined by a low concentration of counterions surrounding the functional particles and the repulsion interaction becomes significant. According to the Derjaguin-Landau-Verwey-Overbeek (7) approximation, the electrostatic repulsion term EE is added to equation (2)

$$E_1 = E_K + E_P + E_{EL} = \frac{3}{2}kT - \frac{HR}{12d} + 64kT\pi Rn\kappa^{-2}\gamma_0^2 e^{\frac{d}{\kappa^{-1}}}, \quad (9)$$

where k is the Bolzmann constant 1.38E-23 JK$^{-1}$,
n is the bulk concentration of ions, m$^{-3}$$_1$,
$\kappa^{-1}$ is the "thickness" of the double layer of counterions, m, and $\gamma_0$ is the parameter of surface potential on the particles, $\gamma_0 \rightarrow 1$.

The "thickness" of the double layer of counter ions [7]

$$\kappa^{-1} = \sqrt{\frac{\varepsilon_0 \varepsilon_R kT}{e^2 z^2 n}}, \text{ where} \quad (10)$$

$\in$ is the permittivity of vacuum, 8.854 E-12 Fm$^{-1}$,
$\in_R$ is the relative permittivity of medium,
E is the elementary charge, 1.602 E-19 C, and
Z is the valence of the counterions in the medium.

The effective energy barrier against coagulation of the functional particles (here, against the SNA contraction) is formed at a sufficient low concentration of counterions. Electrostatic repulsion forces drive the particles to the bottom of the barrier (about 3⁄2 kT) to the distance $d_R$ that can be computed with help of Equation (9)

$$E_1 = E_K + E_P + E_{EL} = \frac{3}{2}kT - \frac{HR}{12d_R} + 64kT\pi Rn\kappa^{-2}\gamma_0^2 e^{-\frac{d_R}{\kappa^{-1}}} \approx \frac{3}{2}kT. \quad (11)$$

Distance $d_R$ determines the regular arrangement of the functional particles according to FIG. 6. The space filling density of the particles is $$\Phi = 0.74\left(\frac{D_H}{D_C}\right)^2 \quad (12)$$

where the coefficient 0.74 represents filling by coordination spheres in the hcp lattice (the highest possible density) and the fraction $D_H/D_C$ represents the ratio between the diameters of the particles and coordination spheres. So, this arrangement satisfies Rule 2.

Both the arrangement of the coordination spheres in the hcp lattice and the electrostatic repulsion forces enables the free movement of all the filaments in the free channels out of the functional particles (FIG. 6).

Arrangement of Particles in the Contraction State

However, the local high concentration of counterions causes the local collapse of the electrical double-layer and partial neutralization of the repulsion. Van der Waal's attraction forces may predominate in these places and this time.

According to FIG. 5 top left and FIG. 7, the arrangement of the coordination spheres in the hcp lattice allows the particles to be arranged in triads and the utmost approach $d_0$ in the contraction state and clamping filament A of a substantially larger diameter than distance $d_0$. Van der Waal's attraction force between pairs of particles can be approximated by the equation $$F_P = \frac{HR}{12d^2} \quad (13)$$

The kinetic pressure of the ions stream along filament A1 (or another effect) tilts the functional particles toward the center of the key element to position 3 (FIG. 7 bottom). A further approach of the particles shifts the actin filament A1 up. Each triad of particles exerts three perpendicular forces $F_H$ on filament A, three forces $F_N$ on filaments N, and three axial forces $F_A$ on one filament A (FIG. 5).

The key element uses an array of triads to induce a powerful total force by multiplication of forces $F_A$.

The key element uses cyclic repetition of single axial shifts (for instance 15 nm) of filaments A1 and A2 to induce a large total contraction (for instance 15 nm×100=1.5 μm).

BRIEF DESCRIPTION OF THE DRAWINGS

FIG. 1. Electrochemical switching cyclic process (redox) and volume changes in the system polypyrol—NaDBS FIG. 2. Top—sarcoere in mammalian skeletal muscle in the relaxation state. Bottom—swinging of the myosin heads drives the thin filament toward the center, thereby shortening the sarcomere, which contracts.

FIG. 3. Construction of the key element of the sliding nanoactuator (SNA). Top—SNA in the relaxation state. The positions of particles and filaments are controlled by electrostatic repulsion forces in a regular lattice. Bottom—SNA in the contraction state. Tilting of the particles drives the filament A1 and A2 toward the center, thereby shortening the SNA, which contracts.

FIG. 4. The density of kinetic $\in_K$, the potential van der Waal' $\in_P$, and the total internal energy $\in$ respectively, of the system of spherical particles versus their radius R. $\phi=0.185$, T=310 K, H=5E-21 J, $d_0=0.424$ nm.

FIG. 5. Tension in filament generation; Top left: Arrangement of the functional spherical particles around filament A; Top right: Force equilibrium in the plane perpendicular to filament A; Bottom left: Declination of particles to filament A and tension $F_A$ generation;

FIG. 6. Detailed arrangement of particles separated by distance $d_R$ (computed from Equation 11) in the key element of the SNA in the relaxation state. In the cross-section (top), hexagonal closest packing of the coordination spheres of diameter $D_C$ controls the arrangement of the spherical particles of diameter D=2R. Half of the apertures between the particles are through the whole system and form free linear channels. They accommodate free A1 filaments, A2 filaments, and M filaments with three hanging filaments N (bottom, not depicted on top), attaching three particles in each single layer. The A1 filaments are attached to the fore Z-plate, A2 filaments to the back Z-plate of the key element (see FIG. 3).

FIG. 7. In the contraction state (ions supply along filament A1), three spherical (or different particles) in every single layer approach each other from position 1 to position 2 (bottom) and compress actin filament A1. The kinetic pressure of the ions stream (or another effect) tilts the particles to position 3 (section M-particle center-A1-particle center-M (bottom). A further approach of the particles shifts actin filament A1 up.

FIG. 8. Interaction of the spherical particles of diameter $D_H=21$ nm in water (H=5E-21 J, $\in_R=80$, T=310 K) according to Equation (9) at contraction (n=1E28 m$^{-3}$, $d_U=0.424$ nm) and relaxation (n=2E24 m$^{-3}$, $d_R=21.6$ nm).

EXAMPLES OF THE INVENTION

Size of Particles—Equation (7)

The optimal radius of the spherical polymer particles in lukewarm water (H=5.10$^{-21}$ J, T=310 K), with an utmost approach $d_0=0.424$ nm (the thickness of two layers of ions Ca$^{2+}$)

$$R^* = 27kT\frac{d_0}{H}$$
$$= 27 \times 1.38 \times 10^{-23} \times 310 \times \frac{0.424 \times 10^{-9}}{5 \times 10^{-21}}$$
$$= 9.80 \times 10^{-9} \text{ m}$$
$$= 9.8 \text{ nm}$$

Utmost van der Waal's Energy Change—Equation (8)

The relevant internal energy change for the space filling $\Phi=0.185$ (spherical particles in the hcp lattice, $D_H/D_C=0.5$, equation (7))

$$\varepsilon^* = \frac{\Phi}{\pi 6^7 (kT)^2}\left(\frac{2H}{d_0}\right)^3$$
$$= -\frac{0.185}{\pi \times 6^7 (k \times 310)^2}\left(\frac{2 \times 5 \times 10^{-21}}{0.424 \times 10^{-9}}\right)^3$$

$$= -150.652 \text{ kJm}^{-3}$$

Complex Interaction Energy Change—Equation (9)

FIG. 8 depicts the interaction energy in dependence on the mutual distance of the spherical nanoparticles with radius R=10.5 nm, the relative permittivity in a water medium $\in_R\sim80$ and the variable concentration of divalent ions according to the parameters on the graph.

Particles in the relaxation state are at the cations lower concentration 2E24 m$^{-3}$, the spherical particles are pushed aside to a mutual distance $d_R=21.6$ nm and the filaments can move freely among the particles.

Above the transformation relaxation→contraction, the concentration of divalent ions is higher than 1E28 m$^{-3}$ and the spherical particle draws to the utmost approach $d_U=0.424$ nm.

INDUSTRIAL APPLICATIONS

SNA can provide engineering science with a simple analogy to the technical actuators of high performance; in comparison with the contemporary actuators in Table 1, the relevant sliding nanoactuators (SNA) have substantially smaller dimensions, larger deformation, shorter response time, higher wattage density, better positioning accuracy, and lower input voltage.

Medicine and industry can primarily apply the sliding nanoactuator. Medicine can use such actuators for drug transportation, diagnostics, active biocompatible polymer implants instead of muscles with a driving voltage comparable to the action potentials, orthopedics, surgery and so on. The coming, electronics and micro (nano)-electro-mechanical-systems (MEMS, NEMS) will use the small size of the key element with short response time, low driving voltage, and large displacement with an excellent positioning accuracy. Large compound systems with high performance can be built using the modular design from the nanometric size of the key elements.

The SNA can be applied extensively for many control tasks in natural and artificial environments. Its microelectronic compatible input signals can be generated by the electronic control circuitry.

The invention claimed is:

1. An electromechanical transducer comprising sliding nanoactuators with at least one nanometric dimension, wherein the electromechanical transducer converts electrical energy to mechanical work by a mutual slip in artificial actin filaments A between artificial myosin filaments M, the artificial actin filaments being connected to artificial Z-plates, the artificial myosin filaments having artificial myosin heads hanging on artificial filaments N, and wherein a cyclic change of repulsive electrostatic and attractive Van der Waals interactions between the artificial myosin heads and the artificial myosin filaments M induces swinging of the artificial myosin heads and drives the artificial Z-plates toward each other.

2. The electromechanical transducer according to claim 1, wherein at least three artificial myosin heads are provided around one of the artificial actin filaments A, said artificial filaments N being thin suspension filaments which fix each artificial myosin head to one of the artificial myosin filaments M and wherein the artificial filaments and artificial myosin heads are placed in a liquid or gaseous medium.

3. The electromechanical transducer according to claim 2, wherein the artificial myosin heads have optimized dimensions, arrangement, mutual approach, material, and temperature, to attain the significant decrease of volume density energy composed of the kinetic energy of the particle's heat vibration and the potential energy of van der Waal's attractive interaction between the particles.

4. The electromechanical transducer according to claim 2, wherein the regular three-dimensional arrangement of the artificial myosin heads and the other artificial components of the sliding nanoactuators results from the electrostatic repulsion of their surface electric charge with the same sign.

5. The electromechanical transducer according to claim 2, wherein the artificial myosin heads around the artificial actin filaments A begin to mutually attract by van der Waal's forces after the number of ions with the opposite charge to the particle's surface increases.

6. The electromechanical transducer according to claim 2, wherein the attractive van der Waal's forces between the artificial myosin heads are transformed by a small deflection from the attraction direction and wherein their further attraction and inclination causes the axial force and mutual slip in the artificial actin filaments A provided between the artificial myosin filaments M.

7. The electromechanical transducer according to claim 2, wherein repeated small slips in the artificial actin filaments A between the artificial myosin filaments cumulate and produce relatively large displacements and forces in a key element.

8. The electromechanical transducer according to claim 2, wherein a large total contraction of the sliding nanoactuators results from the summation of the contractions of key elements in a serial arrangement and a total force of the sliding nanoactuators results from the summation of the forces of said key elements in a parallel arrangement.

9. The electromechanical transducer according to claim 1 wherein an internal structure of the electromechanical transducer is bio-inspired by an internal structure of Z-plates, actin filaments, myosin filaments, myosin heads, and connecting filaments of mammalian skeletal muscle cell.

10. The electromechanical transducer according to claim 9 wherein the internal structure and the function of the electromechanical transducer is adaped in accordance with the requirements of an applied processing technology and/or a serviceable application.

11. The electromechanical transducer according to claim 9 wherein the internal structure and the function of the electromechanical transducer do not require any natural, biomolecular active materials such as proteins, actin, or myosin, except for a biocompatible interface in a biomedical application.

12. The electromechanical transducer according to claim 9, wherein the bio-inspired internal structure functions substantially differently than the function of key elements of a mammalian skeletal muscle cell which is based on a complex cyclic biochemical interaction between actin and myosin filaments that induce swinging of the myosin heads and thereby drives the actin and myosin filaments to slide each other.

13. The electromechanical transducer according to claim 12 wherein the complex cyclic biochemical interaction between the actin and the myosin filaments of a mammalian skeletal muscle cell is substituted in the electromechnical transducer by a simple cyclic exchange of the repulsive electrostatic interactions and the attractive Van der Waals interactions.

14. The electromechanical transducer according to claim 13 wherein the cyclic change of the repulsive electrostatic interactions and the attractive Van der Waals interactions between the artificial myosin heads hanging on the artificial filaments N and the artificial myosin filaments M thereby induces the swinging of the artificial myosin heads and drives the artificial actin filaments together with the artificial Z-plates toward each other.

15. The electromechanical transducer according to claim 14 wherein the working thermodynamic temperature T ranges from zero temperature T→0K to the solid/liquid transition of the artificial myosin heads, and the separation $d_o$ between adjacent artificial myosin heads is in the range $d_0$→0 to $d_0$=10 nm with the combination approaching optimum being given by the equation for spherical particles $R*H=3^3kTd_0$.

16. The electromechanical transducer according to claim 14 wherein the artificial myosin heads are able to reach the minimal gap $d_0$ between them (with the maximum interaction forces) because of a specific arrangement of artificial myosin heads in triads around each artificial actin filament.

17. The electromechanical transducer according to claim 9 wherein the electromechanical transducer acts by a simple lever mechanism, which changes the convergency of the artificial myosin heads to a linear movement of the artificial filaments A through a temporary joint and force generation.

18. The electromechanical transducer according to claim 9 wherein a morphology of the internal structure of the electromechanical transducer may be stabilized by electrostatic repulsion interactions.

19. The electromechanical transducer according to claim 14 wherein the cyclic change of the repulsive electrostatic and the attractive Van der Waals interactions between the artificial myosin heads may be induced by the cyclic change of the local concentration of counterions.

20. The electromechanical transducer according to claim 19 wherein the counterions are positively charged counterions in the case of negatively charged surfaces of the artificial myosin heads.

21. The electromechanical transducer according to claim 14 wherein the Van der Waals attractive interactions in the electromechanical transducer can be substituted by attractive electrostatic interaction between reversely charged surfaces of the artificial myosin heads.

* * * * *